United States Patent [19]

Watanuki

[11] Patent Number: 5,147,130
[45] Date of Patent: Sep. 15, 1992

[54] COOLING LIQUID RECIRCULATION SYSTEM FOR LIGHT SOURCE UNIT

[75] Inventor: Minoru Watanuki, Tokyo, Japan

[73] Assignee: ORC Manufacturing Co., Ltd., Tokyo, Japan

[21] Appl. No.: 430,264

[22] Filed: Nov. 2, 1989

[30] Foreign Application Priority Data

Jun. 21, 1989 [JP] Japan .................................. 1-159045

[51] Int. Cl.⁵ ............................................. F21V 29/00
[52] U.S. Cl. .................................... 362/218; 362/293; 362/294; 362/318; 362/373; 165/104.32; 165/104.33; 313/22; 313/36
[58] Field of Search ................ 362/218, 293, 294, 363, 362/318, 373, 268, 255; 313/12, 17, 22, 24, 33, 36, 44; 165/104.33, 119, 917, 104.32

[56] References Cited

U.S. PATENT DOCUMENTS

| | | |
|---|---|---|
| 3,372,740 | 3/1968 | Kastovich et al. .................. 362/294 |
| 3,624,380 | 11/1971 | Davis .................................. 362/294 |
| 3,739,215 | 6/1973 | Murai .................................... 313/24 |
| 4,047,561 | 9/1977 | Jaster et al. ........................ 165/917 |
| 4,509,104 | 4/1985 | Suzuki et al. ...................... 362/294 |
| 4,813,477 | 3/1989 | Hansen et al. ...................... 165/119 |
| 4,865,123 | 9/1989 | Kawashima et al. ........... 165/104.33 |
| 4,937,717 | 6/1990 | Betzvog, Jr. ........................ 362/294 |

Primary Examiner—Richard R. Cole
Attorney, Agent, or Firm—Cushman, Darby & Cushman

[57] ABSTRACT

In a cooling liquid recirculation system, walls of transparent jacket tubes for cooling a mercury-vapor lamp, which jacket tubes are provided separately from the mercury-vapor in accordance with the prior art are formed in optical filters to thereby decrease the temperature of an object to be illuminated. A recirculation unit of cooling liquid for recirculation of the jacket tubes is connected through an elastic duct to a light source unit such as a mercury-vapor lamp. These components are movable for practical use.

7 Claims, 6 Drawing Sheets

FIG.2(A)
FIG.2(B)
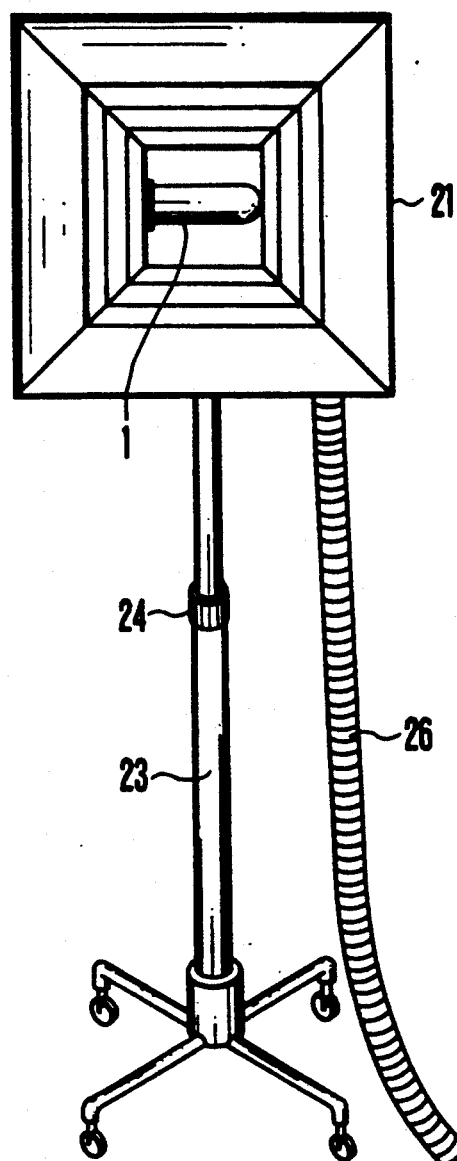
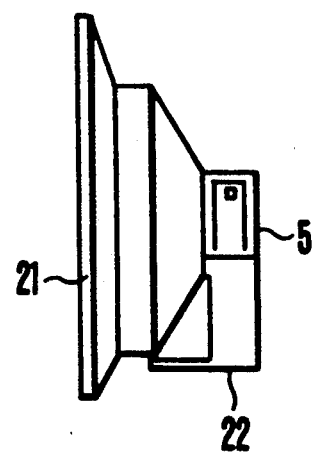
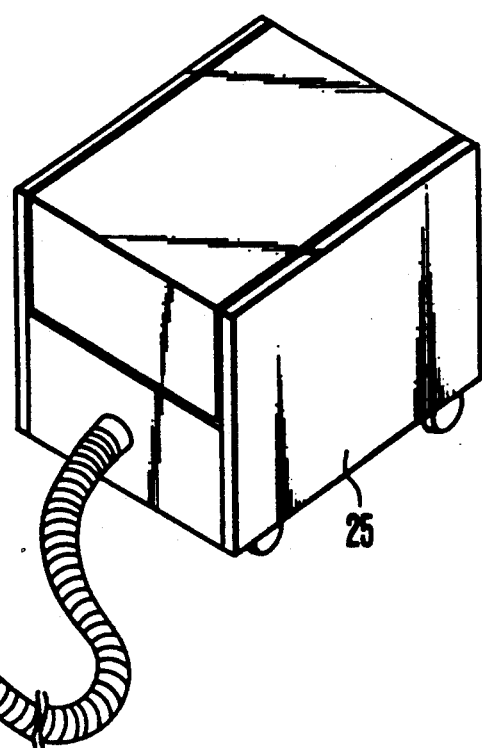

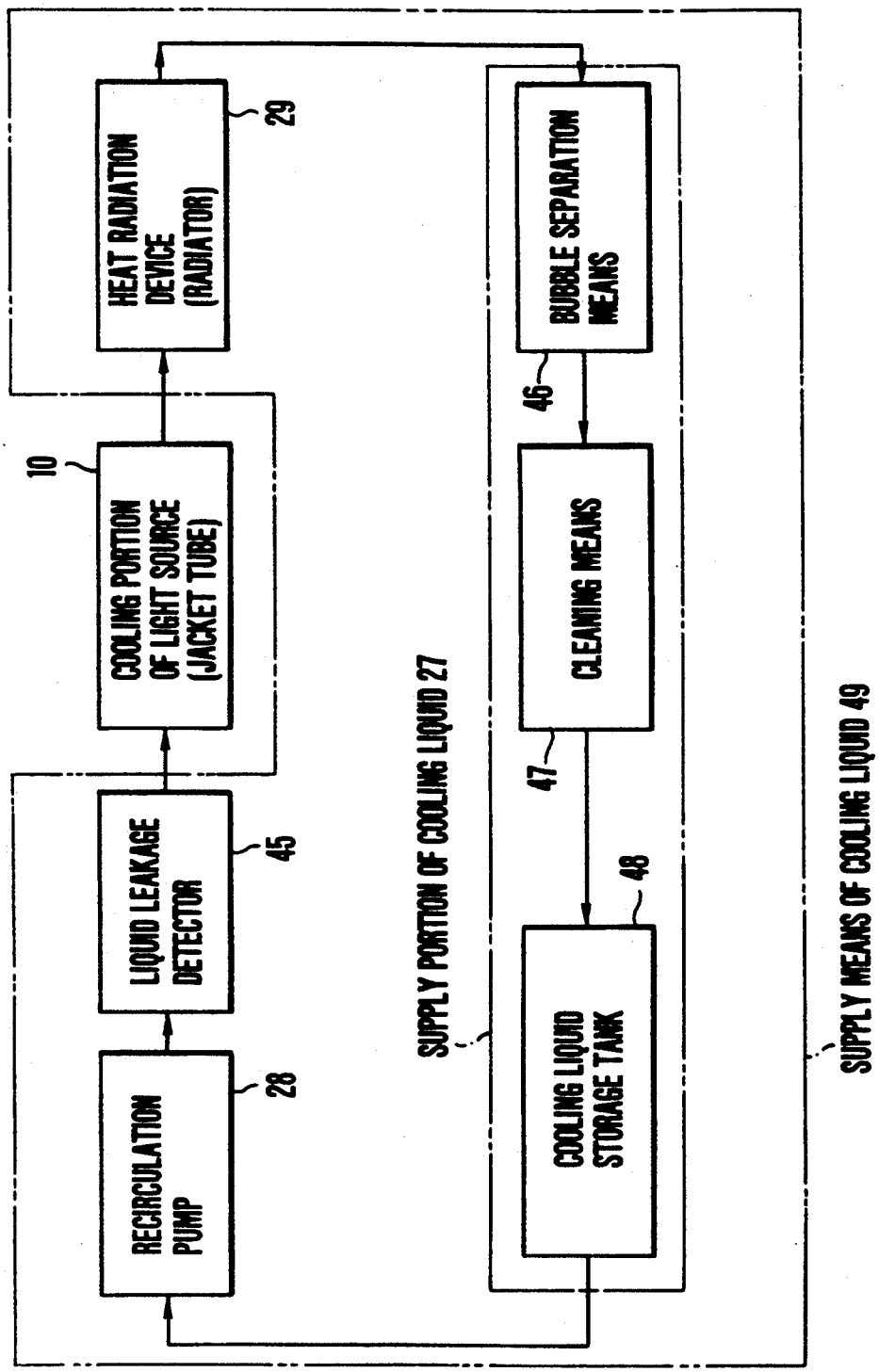

COOLING LIQUID RECIRCULATION SYSTEM FOR LIGHT SOURCE UNIT

BACKGROUND OF THE INVENTION

1. Field of the Invention

The present invention relates to a cooling liquid recirculation system for a light source unit. More particularly the present invention serves to effectively cool a super high voltage mercury-vapor lamp includes a built-in filter used for a photochemical process, and prevents electric shock accidents due to its electrically safe design.

2. Description of Prior Art

Conventionally, ultraviolet rays are irradiated onto a light sensitive material by using a mercury-vapor lamp as a light illuminating tube in order to form an image in the photochemical process. In order to irradiate the wavelengths of light suitable for the light sensitive material, an optical filter is provided separately from the light illuminating tube. For this reason, it is very difficult to prevent elongation/contraction of the object to be projected due to the temperature increases or to prevent the temperature increase of the optical filter due to generated heat. Since a large amount of light is needed for the exposure projection, a large quantity of heat is generated from the light illuminating tube. In order to prevent temperature increases, the light illuminating tube is disposed in a transparent jacket tube through which cooling liquid is recirculated. However, this arrangement does not prevent the temperature increase of the optical filter, which is provided separately from the light illuminating tube, and the elongation/contraction of the irradiated object. According to the invention, in order to solve these problems, a transparent jacket tube through which the cooling liquid is to be recirculated is made of material selected to have an optical filter property for passing wavelengths of light suitable for the light sensitive material, i.e, the irradiated object, and removing wavelengths of light unsuitable for the light sensitive material. Temperature increases of the optical filter and the irradiated object are prevented by recirculating the cooling liquid within the jacket tube.

Conventionally, flowing water or the like is used as the cooling liquid for the jacket tube. However, a large amount of water is needed, and it is difficult to move the equipment because of the water piping system. In addition, it is difficult to control the temperature. Furthermore, if bubbles are formed in the cooling water, the flow resistance is increased, so that the flow is not smooth. As a result, the amount of exposure light is adversely effected.

SUMMARY OF THE INVENTION

In order to overcome the above-noted defects, the present invention provides a system including a cooling portion for a light source unit and a cooling liquid supply unit for recirculating cooling liquid for the light source unit. The cooling liquid supply unit has a supply portion for the cooling liquid, a recirculation pump, a liquid leakage detector and a radiator. Further, the cooling liquid supply unit and the light source unit are connected with each other through an elastic duct cord through which are passed a pipe for the cooling liquid and an electric wire.

According to the present light source unit, both end portions of the light illuminating tube of a discharge lamp are electrically insulated from the cooling liquid except for the terminal portions to be connected to electrodes. A transparent jacket tube mounted on the light illuminating tube is structured so as to maintain the electrically insulated condition of the light illuminating tube. The cooling liquid introduced through a supply port of the jacket tube cools the light illuminating tube. The transparent jacket tube material serves as an optical filter for absorbing a light component having a wavelength which is not necessary for a light sensitive material of the projected object. The jacket tube is of the single or dual structure type to thereby precisely absorb and remove the component having the wavelength which is not needed for the light sensitive material or the like.

The cooling liquid supply portion includes a cooling liquid cleaning means for cleaning the introduced cooling liquid with cleaning material, a bubble separation means for separating bubbles generated in the flow path of the cooling liquid within the cleaning means and for releasing the bubbles to a discharge path, and a cooling liquid storage means for storing the cooling liquid dropped from the cooling liquid cleaning means and for communicating with the recirculation pump.

According to the invention, a lowering of the liquid level due to natural evaporation or liquid leakage of the cooling liquid is detected by the liquid leakage detector and an amount of cooling liquid corresponding to the reduction of the cooling liquid is replenished. The radiator may be of the hydraulic or pneumatic cooling type and is located prior to an inlet portion of the cooling liquid supply portion.

With such an arrangement, when the cooling liquid is passed through a space between the inner and outer jacket tubes, the inner and outer jacket tubes having optical filter effects are cooled, and when the cooling liquid is passed through a space between the inner jacket tube and the light illuminating tube, the light illuminating tube is cooled. Further, when the cooling liquid is returned back to the cooling liquid tank, the bubbles within the cooling liquid are discharged from an air discharge port formed in the cooling liquid tank. The reduction of the amount of the cooling liquid is detected and a suitable amount of the cooling liquid is replenished. There is no fear that the cooling liquid would leak from the liquid tank as has been encountered in the prior art system.

BRIEF DESCRIPTION OF THE DRAWINGS

In the accompanying drawings:

FIG. 2A is a perspective view showing an overall arrangement of the system according to the invention;

FIG. 2B is a side elevational view showing a mounted state of the reflector;

FIG. 3 is a block diagram showing a cooling liquid recirculation unit;

DESCRIPTION OF THE PREFERRED EMBODIMENTS

Figure 1:
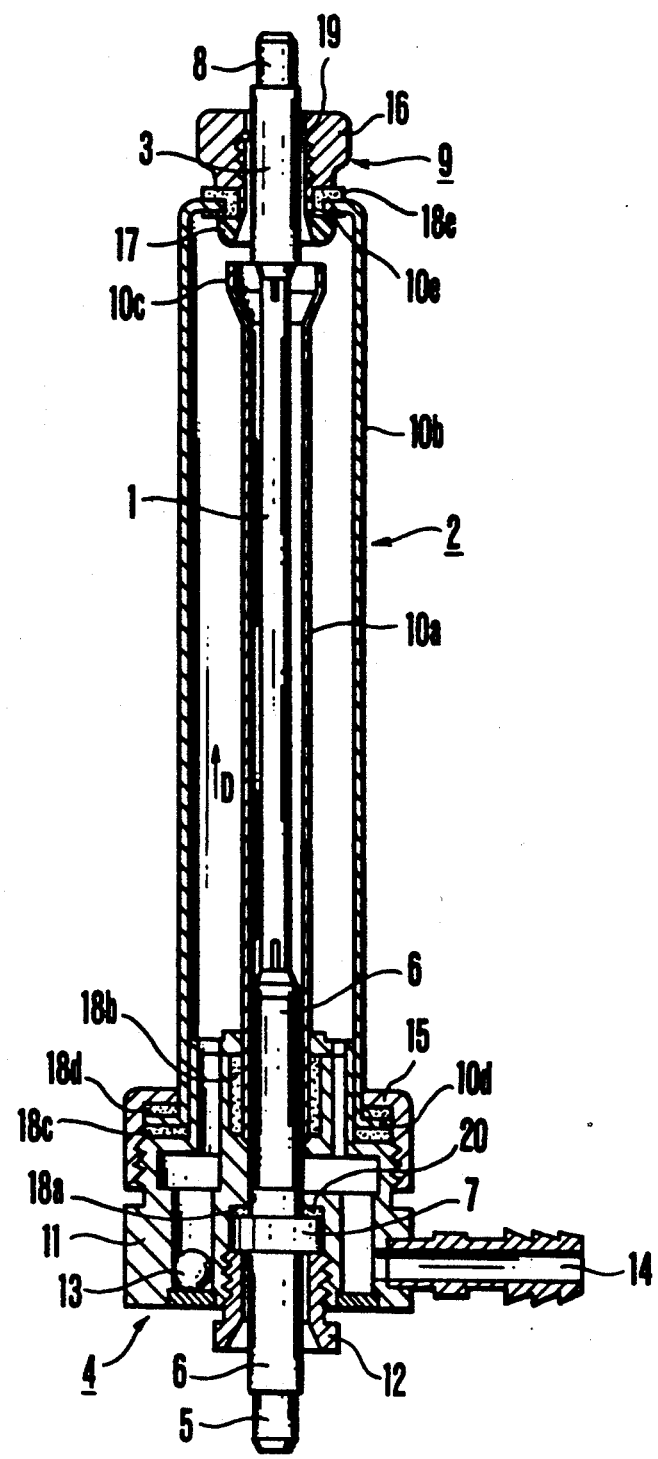
FIG. 1 is a cross-sectional view showing a primary part of a light source unit in accordance with one embodiment of the invention.

A system according to the invention will now be described with reference to the accompanying drawings:

FIG. 1 is a cross-sectional view of the primary part of a super high voltage mercury-vapor lamp used in a system in accordance with one embodiment of the invention. A light illuminating portion thereof is composed of a light illuminating tube 1 made of transparent material in the form of a cylinder. A first insulating cylindrical portion 3 and a second insulating cylindrical portion 6, each being made of steatite having a high electric-insulating property and having a diameter somewhat larger than that of the light illuminating tube 1, are air-tightly fixed to both ends of the light illuminating tube 1. The first and second insulating portions 3, 6 serve to insulate both ends of the tube 1 and to maintain the insulation of the fixed portions between tube walls of the light illuminating tube and electrodes.

A lower portion of the light illuminating tube 1 is inserted into a central portion of a holder 11, and a retainer stepped flange portion 7 of the second insulating portion 6 is pressingly fixed through a packing 18a to an associated stepped portion 20 of the holder 11 by a fastening screw 12.

A first transparent jacket tube 10a opened at its upper end and having an inner diameter larger than the outer diameter of the first and second insulating portions 3, 6 is provided substantially coaxially with light illuminating tube 1. A lower end portion of the jacket tube 10a is inserted into the holder 11 so as to surround the insulating portion 6 and is fixed through a packing 18b by the fastening screw 12.

A second transparent cylindrical jacket tube 10b is provided around the first jacket tube 10a to form a jacket portion 2. An upper end portion 10e of the second jacket tube 10b is decreased radially inwardly, whereas a lower end portion 10d thereof is enlarged radially outwardly.

An upper portion of the light illuminating tube 1 is press-fitted by a receiver 17 through which the insulating portion 3 is inserted, and a fastener 16. A radially outwardly opened annular recess is formed in a packing 18e inserted into the receiver 17. The radially inwardly extending end portion 10e of the upper portion of the second jacket tube 10b is inserted into the annular recess of the packing 18e. The fastener 16 has an O-ring packing 19 in its inside. The lower end of the jacket tube 10b is threadedly fixed to the holder 11 by a fastener 15 through a packing 18d laid on the radially outwardly extending end of the tube and through another packing 18c laid on an upwardly facing annular flat portion of the holder 11.

With such an arrangement, liquid within the jacket 10b is sealed so that the liquid will not leak to the outside therefrom.

In the holder 11, there are formed a liquid feed port 13, a liquid path in fluid communication with the liquid feed port 13 between the first jacket tube 10a and the second jacket tube 10b, another liquid path between the second insulating portion 6 and the first jacket tube 10a and a liquid discharge port 14 for discharging the liquid. With such an arrangement, it is possible to effectively cool the light illuminating tube 1 by the passage of the cooling liquid introduced from the liquid feed port 13 of the holder 11 and passing through a space between the first and second jacket tubes 10a and 10b and from the upper portion of the second jacket tube 10b through a space between an inner wall of the first jacket tube 10a and the outer wall of the light illuminating tube 1 to the outside.

FIG. 2A is a schematic view showing the overall structure of the system, and FIG. 2B is a side elevational view of a mounted reflector. The reflector 21 is provided on the sides and back of the light illuminating tube 1 so that the light may be projected forwardly. A mounting portion 5 of the light illuminating tube 1 and the reflector 21 are integrally formed with each other through an auxiliary mounting plate 22. The auxiliary mounting plate 22 is mounted at a top end of a post 23. The post 23 has a grip 24 in its midway, thereby varying the length thereof as desired. An electric power source and cooling liquid supply means 25 is connected to the light illuminating tube 1 through a duct cord 26.

FIG. 3 is a block diagram of the cooling liquid supply means. As shown in FIG. 3, the cooling liquid supply means 49 comprises a cooling liquid supply portion 27, a recirculation pump 28, a liquid leakage detector 45, and a light source cooling means such as the jacket tube 10 and a radiator 29. The liquid leakage detector 45 is used to detect natural evaporation and liquid leakage. The radiator 29 is of the pneumatic cooling type or the hydraulic cooling type and is located in front of a mesh of the cooling liquid supply portion 27.

Figure 4:
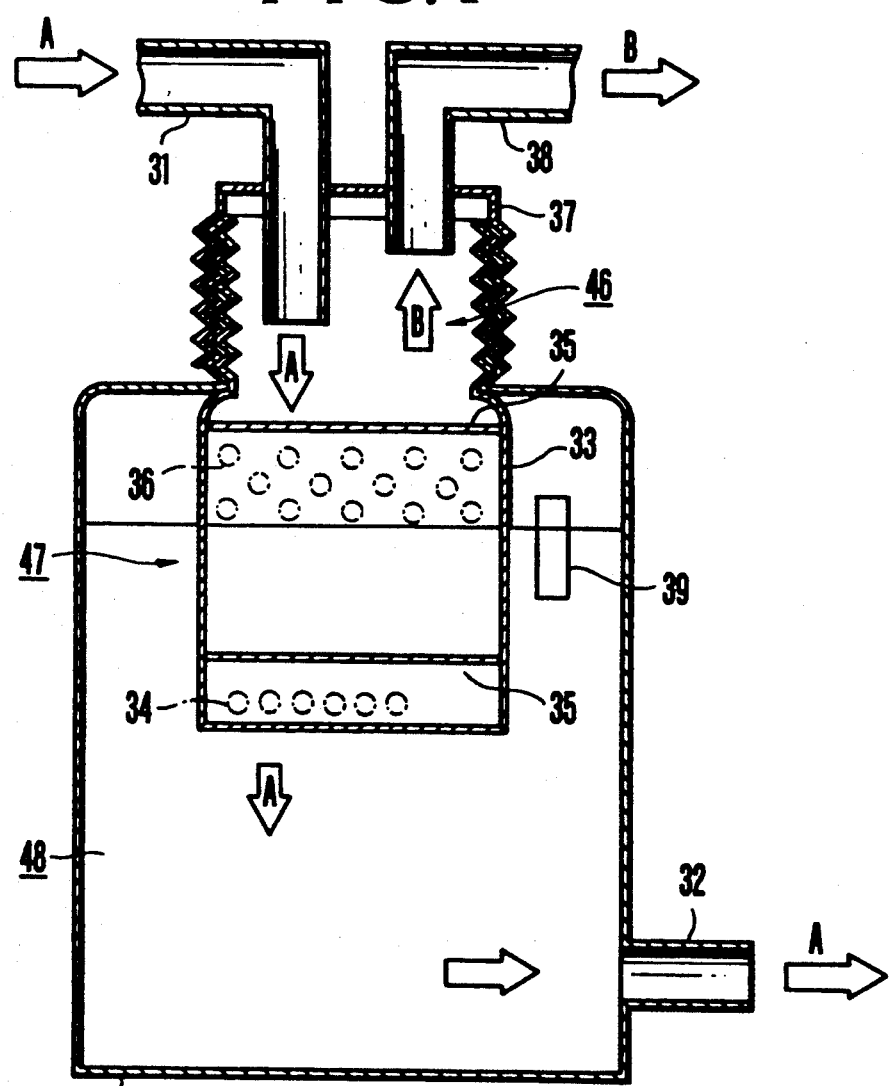
FIG. 4 is a view showing a cooling liquid supply portion in accordance with the system of one embodiment.
Figure 5:
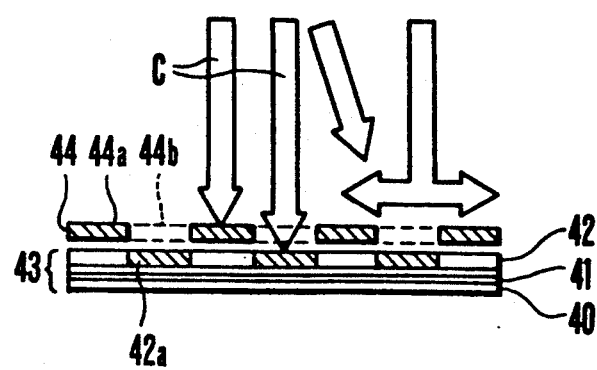
FIG. 5 is a cross-sectional view showing a photochemical process to which the invention is applied.

FIG. 4 shows a cooling liquid supply portion in which a cooling liquid flowing pipe 31 is formed in an upper portion of a tank 30, and the pipe 31 is connected by the duct cord 26 through the radiator 29 to the cooling liquid discharge port 14 formed in the holder 11 of the light illuminating tube 1. A cooling liquid discharge port 32 is formed in a lower portion of the tank 30. The tank 30 and the cooling liquid feed port 13 are connected to each other by the duct cord 26 through the recirculation pump 28 and the liquid leakage detector 45. A cleaner tank 33 is suspended in the tank 30. Cooling liquid discharge ports 34 are formed in a lower portion of the cleaner tank 33. A cleaning material such as ion exchanging resin, active carbon and the like provided at its upper and lower portions with meshes 35 is incorporated in the cleaner tank 33.

A cooling liquid cleaning means 47 for passing the cooling liquid that is introduced from the cooling liquid flowing pipe 31 as indicated by the arrow A, under a gravitational force without application of the pressure thereto, is formed and the cooling liquid is cleaned and stored in a cooling liquid storage portion 48. The cooling liquid is discharged from the discharge port 32 to thereby prevent the contamination of the light source unit and oxidation. A lid 37 is attached on the top portion of the tank 30. An air discharge port 38 is formed in the lid 37 to form a separation means 46 for discharging the air, entrained in the cooling liquid, to the outside as shown by the arrow B. A liquid level sensor 39 is provided in an inner wall of the tank 30 for detecting a suitable amount of the cooling liquid.

The operation of the system and its application to a photochemical process will now be explained. In the photochemical process, a light sensitive layer 42 adhered by adhesive 41 on a substrate 40 which is a projected object is provided to form a light sensitive substrate 43. An image forming film 44 is arranged on the light sensitive substrate 43. The process is performed under vacuum. An ultraviolet ray C having a wavelength so that the ray is interrupted at positive portions 44a and is passed through negative portions 44b is projected onto the image forming film 44. As a result, portions 42a of the light sensitive layer 42 corresponding to the negative portions 44b are light-sensed to form a photochemical plate.

Figure 6:
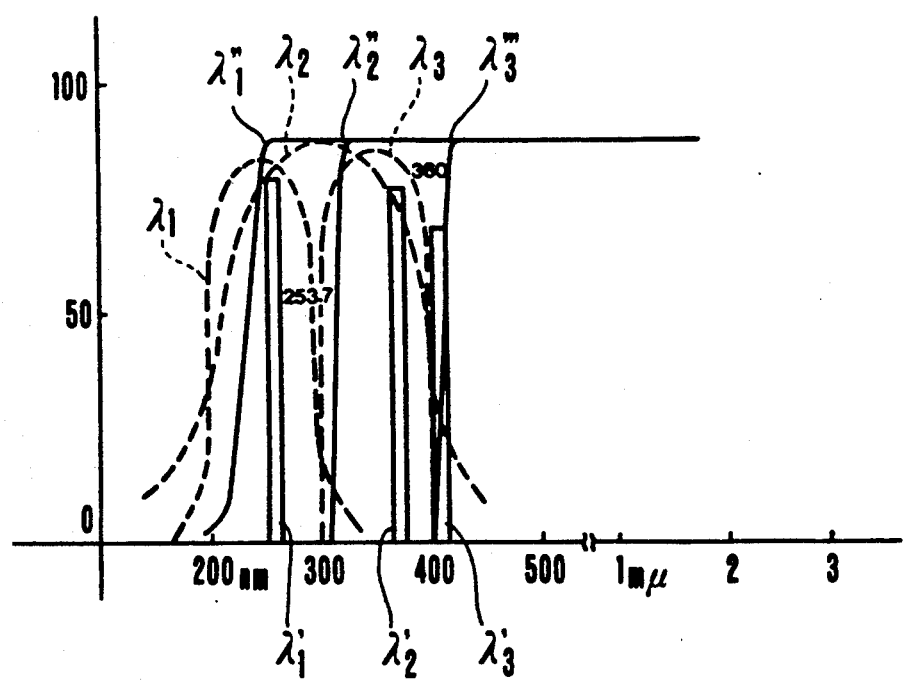
FIG. 6 is a graph showing the ultraviolet ray main spectrum used in the system of the invention.

Since the wavelengths of light to be absorbed differ in accordance with the kind of light sensitive material, it is necessary to preset the wavelength of ultraviolet light to be projected. For example, as shown in FIG. 6, when light sensitive material whose wavelengths to be absorbed are different from each another ($\lambda_1 = 200$ to 300 nm, $\lambda = 200$ to 400 nm and $\lambda_3 = 300$ to 400 nm) is selectively used, it is necessary to preset the wavelengths of ultraviolet light to an optimum condition. Accordingly, when the main spectrum of ultraviolet light for the illuminating tube 1 is $\lambda_1' = 253.7$ nm, a quartz glass filter whose optical filter effect is $\lambda_1'' = = 200$ nm to 4 m$\mu$ is used. When the main spectrum of ultraviolet light for the illuminating tube 1 is $\lambda_2 \cdot 360$ nm, a soda glass and lead glass filter of $\lambda_2'' = 310$ nm to 2 m$\mu$ is used. When the main spectrum of ultraviolet light for the illuminating tube 1 is $\lambda_3' = 414$ nm, a soda glass filter of $\lambda_3 = 300$ nm to 4 m$\mu$ is used. It is possible to use different glass filters in combination.

Accordingly, the kind of light illuminating tube 1 is selected in advance in accordance with the kind of light sensitive material to be used, and at the same time, the filter effect is preset by selecting the first and second jacket tubes 10a and 10b. If the cooling liquid is recirculated through the outer space and inner space as indicated by the arrow D (FIG. 1) and the light illuminating tube 1 is turned on, then the ultraviolet ray C having a predetermined wavelength may reach a predetermined position outside the light source unit.

The cooling liquid is introduced from the cooling liquid feed port 13 to the outer space as shown in FIG. 1, to cool the light illuminating tube 1 through the inner space and is discharged from the cooling liquid discharge port 14. The recirculation of the cooling liquid is conducted by the recirculation pump 28 and cooling liquid supply portion 27. The cooling liquid whose temperature has been elevated is again cooled down by the pneumatic or hydraulic cooling type radiator 29, so that the cooling liquid is always supplied to the light illuminating tube 1 under the cooled condition.

The cooling liquid is contaminated due to its passage of the inner and outer spaces. However, after its passage through the cleaner tank 33 within the tank 30, the liquid is cleaned and again fed to the inner and outer spaces. Within the cleaner tank 33, the cooling liquid is passed through the cleaning material 36, whereupon the cooling liquid 30 causes the cleaning material 36 to be mobile. However, the cleaning material 36 is suppressed by the mesh 35 from above and from below, to thereby prevent the leakage of the cleaning material to the outside. Also, air is likely to be entrained into the cooling liquid in the cleaner tank 33 to generate bubbles. The bubbles cause the flow resistance to be increased in the tank 30. It is therefore impossible to smoothly flow the cooling liquid. The cooling liquid would overflow from the tank 30. However, the entrained air is discharged from the air discharge port 38 to the outside, so that the generation of bubbles may be prevented and the liquid pressure is released and the cooling liquid introduced into the tank 30 is passed through the cleaner by gravitational force.

Thus, heat rays of the light emitted from the light illuminating tube 1 are interrupted by the optical filter effect of the jacket tubes 10a and 10b having the filtering effect. The light illuminating tube 1 is cooled down by the cooling liquid. A predetermined ultraviolet ray is only emitted from the tube 1 to the outside. The irradiated ultraviolet ray effectively reaches the image forming film 44 and the light sensitive substrate 43 by the reflector 21. In addition, the predetermined ultraviolet ray may be obtained by replacing the jacket tubes 10a and 10b by those having the predetermined optical filter effect.

Figure 7A:
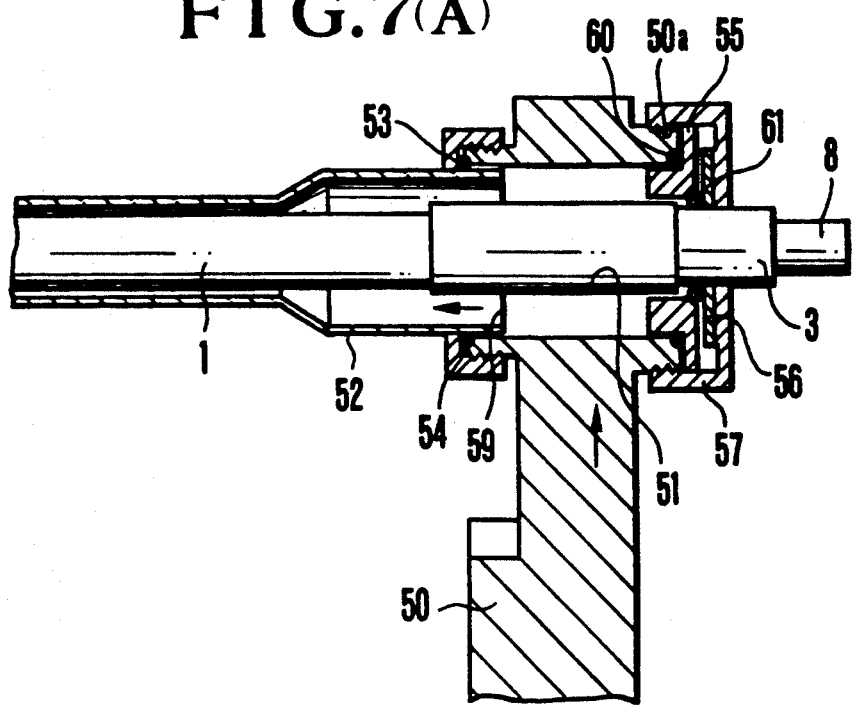
FIG. 7A is a cross-sectional view showing a both-end support type jacket tube according to one embodiment of a light source unit of the system according to the invention.
Figure 7B:
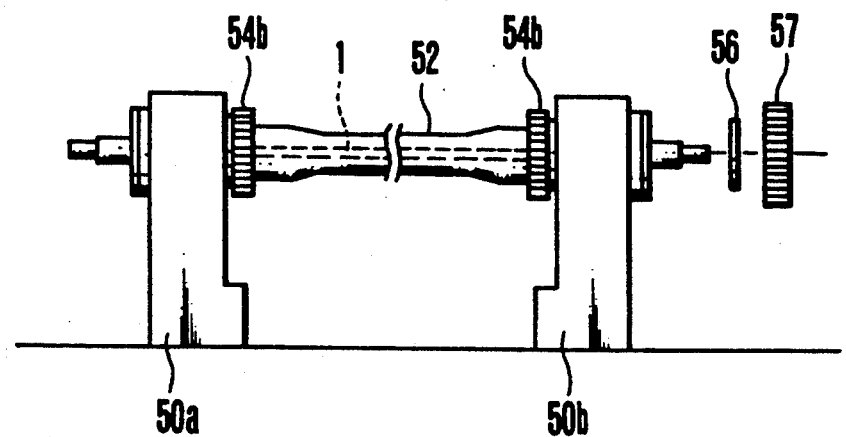
FIGS. 7B and 7C are illustrations for the order of attaching/detaching of the single structure jacket tube with respect to a light illuminating portion of a high voltage mercury-vapor lamp.
Figure 7C:
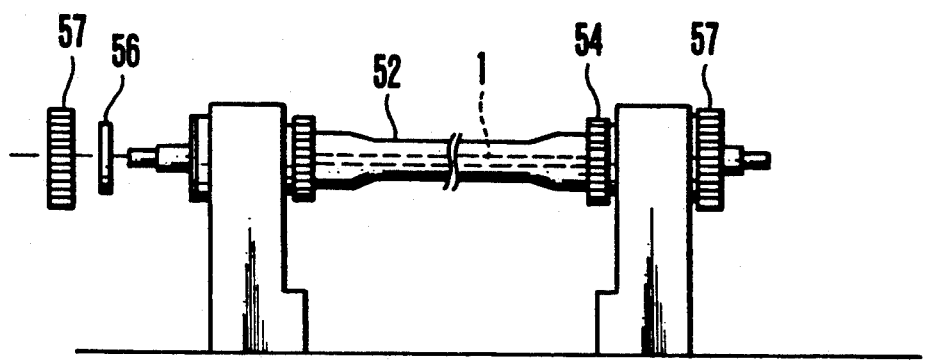

Although the both end support system is used in the foregoing embodiment by the dual structure jacket tubes 10a and 10b, it is possible to use a single structure jacket tube as shown in FIGS. 7A to 7C.

FIG. 7A is a cross-sectional view showing an end portion on one side of the single structure jacket tube. In FIG. 7a, reference numeral 1 denotes a light illuminating tube; 3, an insulating portion; 8, electrode connection terminal; and 51, a retainer portion to a support member 50. A tip end of the single structure jacket tube 52 is fastened by a fastening screw 54 to the support member 50 through an O-ring packing 53. An end peripheral portion of the retainer portion 51 of the light illuminating tube 1 extending from the support member 50 is fastened by a fastening screw 57 threadedly engaged with the tip end 50a of the support member 50 by a receiver 55 and a washer 56. Also, a supply port 59 between the retainer portion of the light illuminating tube 1 and the jacket tube 52 is formed in the support member 50. Numeral 60 denotes an O-ring packing provided between the support member tip portion 50a and the receiver 55. Numeral 61 denotes an O-ring packing provided between the receiver 55 and a washer 56.

Furthermore, in the opposite end support structure, as shown in FIG. 7A, the opposite ends of the light illuminating tube 1 are fixed by an insulator for electrically insulating the opposite ends. The O-ring packing 61 is fixed by a fastening screw 57 with a washer 56 for insulation against the leakage of cooling liquid. The terminal 8 of the electrode is projected to the outside of the cooling jacket tube 52. Thus, both the electrodes of the light illuminating tube 1 are insulative against the cooling liquid.

FIGS. 7B and 7C are illustrations of the steps for attaching and detaching the single structure jacket tube with respect to the light illuminating tube of the mercury-vapor lamp. As shown in FIG. 7B, fastening screws 54a and 54b are attached to the opposite ends of the jacket tube 52 to which attached are the support members 50a and 50b. The tip end of the cooling liquid introduction pipe is fixed in alignment with the feed port or discharge port 59. Subsequently, the light illuminating tube 1 of the high voltage mercury-vapor lamp is inserted into the jacket tube 52. The receiver 55, the washer 56 and the O-ring packing 61 are interposed in the right or left retainer portion 51 of the light illuminating tube 1 and are fixed by the fastening screw 57.

The steps for removing the light illuminating tube 1 from the inside of the jacket tube 52 are performed in the opposite order as the foregoing assembling order.

It is apparent that the invention is not limited to the photochemical process but may be applied to various light source units.

According to the invention, since the jacket tubes mounted in the dual structure on the light illuminating tube are formed in filters for passing ultraviolet light having predetermined wavelength components and the cooling liquid is recirculated from the cooling liquid tank in the jacket tubes, the light illuminating tube and the jacket tubes that have been heated by absorbing the heat rays with the filter effect may be simultaneously cooled. Also, the bubbles entrained in the cooling liquid in the cleaner tank in the cooling liquid tank cause the flow resistance to be increased to overflow the cooling liquid to the outside of the tank according to the prior art but according to the invention, the air discharge port is formed in the cooling liquid tank to escape the bubbles. Accordingly, there is no fear that the cooling liquid would overflow from the upper lid. The jacket tubes are formed of optical filter material and the electric power source and cooling liquid supply unit are disposed away from the light source unit by the elastic cord duct having the electric wire and the cooling liquid introduction pipe. Accordingly, the tasks may be practically solved without enlarging in size the cooling liquid recirculation system for the discharge lamp.

What is claimed is:

1. A movable cooling liquid recirculation system for a light source unit, said system comprising:

cooling means disposed to surround the light source unit for removing heat generated by the light source unit;

cooling liquid supply means for circulating a cooling liquid in said system, said cooling liquid supply means including:
   (a) a storage tank for storing the cooling liquid;
   (b) cleaning means for cleaning the cooling liquid; and
   (c) bubble separation means for removing entrained air from the cooling liquid;

pump means for recirculating the cooling liquid in said system; and connecting means for flexibly connecting said pump means, said cooling means and said cooling liquid supply means so that the cooling liquid can be recirculated between said cooling means and said cooling liquid supply means via said pump means.

2. A system as in claim 1, said connecting means comprising an elastic duct cord having internally disposed a flexible pipe for carrying the cooling liquid and electrical wires for supplying electrical power to electrodes of the light source unit.

3. A system as in claim 1, further comprising a radiator for cooling the cooling liquid after it passes through said cooling means.

4. A system as in claim 1, said cooling means comprising a jacket tube made of material having optical properties for filtering out predetermined wavelengths of light.

5. A system as in claim 1, said cooling liquid supply means being mounted within a movable frame.

6. A system as in claim 1, said cooling means and the light source unit being mounted on a movable stand.

7. A system as in claim 1, said cooling liquid supply means further including a leakage detector means for detecting a low level of cooling liquid in said system.

* * * * *